(12) United States Patent
Kobayashi et al.

(10) Patent No.: US 6,448,175 B1
(45) Date of Patent: Sep. 10, 2002

(54) METHOD FOR FORMING INSULATING THIN FILMS

(75) Inventors: Akihiko Kobayashi; Katsutoshi Mine; Takashi Nakamura; Motoshi Sasaki; Kiyotaka Sawa, all of Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 127 days.

(21) Appl. No.: 09/656,728

(22) Filed: Sep. 7, 2000

Related U.S. Application Data

(63) Continuation of application No. 09/136,988, filed on Aug. 20, 1998, now abandoned.

(30) Foreign Application Priority Data

Aug. 29, 1997 (JP) .............................................. 9-234593
Aug. 29, 1997 (JP) .............................................. 9-234610

(51) Int. Cl.$^7$ .......................................... H01L 21/4763
(52) U.S. Cl. ....................................... 438/637; 438/622
(58) Field of Search ................................ 438/637, 622, 438/618, 787

(56) References Cited

U.S. PATENT DOCUMENTS

| | | | |
|---|---|---|---|
| 3,615,272 A | 10/1971 | Collins et al. ................. | 23/366 |
| 4,617,251 A | 10/1986 | Sizensky ...................... | 430/256 |
| 5,334,332 A | 8/1994 | Lee ............................. | 252/548 |
| 5,416,190 A | 5/1995 | Mine et al. .................. | 528/492 |
| 5,506,177 A | 4/1996 | Kishimoto et al. .......... | 437/195 |
| 5,609,925 A | 3/1997 | Camilletti et al. .......... | 427/503 |
| 5,818,111 A | 10/1998 | Jeng et al. .................. | 257/776 |
| 5,866,197 A | 2/1999 | Bremmer et al. ............. | 427/96 |
| 6,046,104 A * | 4/2000 | Kepler ........................ | 438/637 |

FOREIGN PATENT DOCUMENTS

| | | | |
|---|---|---|---|
| EP | 0 596 515 A1 | 11/1992 | ............. G03F/7/42 |
| EP | 0 810 648 A2 | 5/1997 | ........... H01L/21/44 |
| EP | 0 790 645 A2 | 8/1997 | ......... H01L/21/768 |

OTHER PUBLICATIONS

S.P. Jeng et al., Highly Porous Interlayer Dielectric for Interconnect Capacitance Reduction. 1995, IEEE, pp. 61–62.*

G.A. Dixit et al., An Integrated Low Resistance Aluminum Plug and Low–k Polymer Dielectric for High Performance 0.25 micron Interconnects. 1996, IEEE, pp. 86–87.*

E. Tamaoka et al., Suppressing Oxidation of Hydrogen Silsesquioxane Films by Using H2O Plasma in Ashing Process. 1998, IEEE, pp. 98–48 to 98–50.*

* cited by examiner

*Primary Examiner*—Olik Chaudhuri
*Assistant Examiner*—Anh Duy Mai
(74) *Attorney, Agent, or Firm*—Rick D. Streu; Sharon K. Severance

(57) ABSTRACT

To provide a method for forming insulating thin films that can induce condensation of silanol and dehydration to a high degree at or near ambient pressure.

An interlevel dielectric layer is formed on a semiconductor substrate by coating hydrogen silsesquioxane resin onto the substrate and curing the hydrogen silsesquioxane resin to produce an interlevel dielectric layer. This interlevel dielectric layer is then heated at a pressure from 1 to 1,000 torr at a temperature from 150 to 550° C.

18 Claims, 3 Drawing Sheets

METHOD FOR FORMING INSULATING THIN FILMS

This application is a continuation of U.S. patent application Ser. No. 09/136,988, filed Aug. 20, 1998 now abandoned.

FIELD OF THE INVENTION

This invention relates to methods for forming insulating thin films for semiconductor devices wherein the method can induce condensation of silanol and dehydration to a high degree at or near ambient pressure. This invention also relates to a semiconductor device comprising an insulating thin film produced by the method of this invention wherein conductive layer corrosion is inhibited, deterioration in insulating film performance is inhibited, and an increase in contact resistance between the upper and lower level interconnects in multilevel interconnect structures is inhibited.

BACKGROUND OF THE INVENTION

The increasing miniaturization of semiconductor elements (i.e., the increasingly high level of integration of semiconductor devices) has led to the use of multilevel interconnect structures on semiconductor substrates. Silicon oxide films produced by such methods as CVD and spin coating are generally used for the insulating films in semiconductor devices that contain such multilevel interconnect structures.

Semiconductor devices that contain multilevel interconnect structures can be fabricated by forming the lower level interconnects on the semiconductor substrate with separation therefrom by an interposed insulating layer; thereafter forming an interlevel dielectric layer; elaborating via holes to the lower level interconnects by selectively etching this interlevel dielectric layer; and filling these via holes with metal to create an electrical connection between the lower level interconnects and the upper level interconnects.

However, when the silicon oxide film interlevel dielectric layers are exposed to, for example, the reagent solutions used for resist film removal during the etching step, large numbers of hydrophilic silanol groups (Si—OH) are produced in the thin film. This causes the problem of an increased hygroscopicity or moisture absorptivity by the film. The resulting absorption of moisture by the interlevel dielectric level can end up causing corrosion of the conductive layer and a deterioration in the insulating performance of the interlevel dielectric layer. In addition, moisture that has become bound on the surface of the interlevel dielectric layer and/or has entered its interior can produce defects by outmigrating from the interlevel dielectric layer during the process of filling the via holes with metal and thereby increasing the contact resistance between the lower level interconnects and upper level interconnects. This activity becomes very significant as via holes shrink in size accompanying the miniaturization of semiconductor elements.

One countermeasure to this problem is to induce a very thorough condensation of the silanol and dehydration by heating the semiconductor substrate—after via hole formation in the interlevel dielectric layer—under a high vacuum around $10^{-8}$ torr. This approach, however, requires the use of a vacuum plant capable of creating a high vacuum around $10^{-8}$ torr and as a result is associated with such negatives as raising the cost of semiconductor device fabrication and making process control more difficult.

An object of the this invention is to provide a method for forming insulating thin films that can induce a high degree of condensation of the silanol groups and dehydration at or near ambient pressure, that is, at ambient pressure, or a slightly increased pressure, or a slightly reduced pressure.

Another object of this invention is to provide a semiconductor device and method for fabricating in which conductive layer corrosion is inhibited, deterioration in insulating thin film performance is inhibited, and an increase in contact resistance between upper and lower level interconnects in multilevel interconnect structures is inhibited.

SUMMARY OF THE INVENTION

This invention pertains to a method for forming insulating thin films wherein the method comprises coating hydrogen silsesquioxane resin onto a substrate, curing the hydrogen silsesquioxane resin to produce an insulating thin film on the substrate and heat treating the resulting insulating thin film under a pressure of 1 to 1,000 torr at 150 to 550° C. A high degree of condensation of silanol and dehydration can be induced in the insulating thin films by the heat treatment.

This invention further pertains to a process for the fabrication of semiconductor devices comprising an interconnect structure comprising at least one electrically conductive layer separated by an interposed insulating thin film wherein the interposed insulating thin film is produced by the method comprising baking hydrogen silsesquioxane resin and heat treating the resulting insulating thin film under a pressure of 1 to 1,000 torr at 150 to 550° C.

DETAILED DESCRIPTION OF THE INVENTION

This invention pertains to a method for forming insulating thin films wherein the method comprises forming an insulating thin film on a substrate by baking hydrogen silsesquioxane resin ("HSR") and heat treating the resulting insulating thin film under a pressure of 1 to 1,000 torr at 150 to 550° C. A high degree of condensation of silanol and dehydration can be induced in the insulating thin films by the heat treatment. It is thought that this occurs due to the close structural proximity of the silanol groups in HSR-derived insulating thin films, which makes possible the elimination of these silanol groups at low energies.

By operating either in the vicinity of ambient pressure or with the use of just an inexpensive low-vacuum plant, a thorough condensation of the silanol groups that have been produced in the thin film and a thorough dehydration of the moisture bound to or contained in the thin film is possible. This in turn prevents moisture absorption by the insulating film in a semiconductor device and can thereby inhibit corrosion of the conductive layers and can inhibit reductions in the performance of the insulating thin films. In addition, by enabling a reduction in the amount of moisture that outmigrates from the insulating thin film during the infilling of via holes with metal, this invention can prevent increases in the contact resistance between upper and lower level interconnects that would otherwise occur during the fabrication of semiconductor devices in which the conductive layers of a multilevel interconnect structure are electrically interconnected through via holes.

Figure 1:
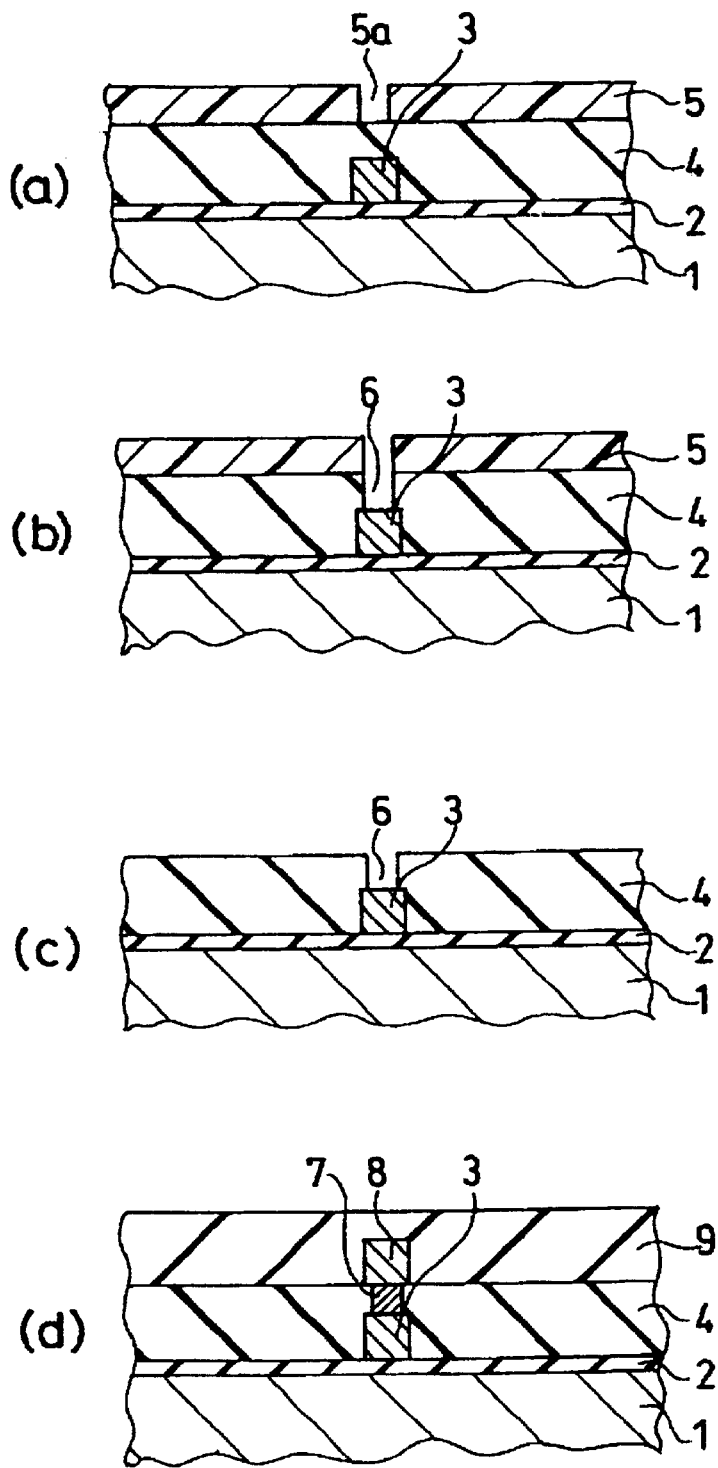
FIG. 1(a) through (d) are cross sections of the individual stages in a process for semiconductor device fabrication using the method for forming an insulating thin film of this invention.

As shown in FIG. 1(a), a BPSG film is deposited over the entire surface of a semiconductor substrate 1 (silicon wafer) on whose surface a semiconductor element (not shown) has already been formed. This is reflowed to form a base insulating layer 2. Next, an electrically conductive layer is formed by sputtering a metal, e.g., aluminum, on the base insulating layer 2, and a lower level interconnect 3 is formed by patterning this metallization by a known method.

A solution of hydrogen silsesquioxane resin dissolved in solvent is then coated over the entire surface of the semiconductor substrate 1 by spin coating. This hydrogen silsesquioxane resin is subsequently cured, by heating or exposure to high energy radiation, to form an interlevel dielectric layer 4 with a planarized surface. A resist film 5 comprising organic resin is formed on this interlevel dielectric layer 4, and this resist film 5 is thereafter patterned so as to provide an opening 5a directly above the lower level interconnect 3.

Subsequent to this and as shown in FIG. 1(b), the interlevel dielectric layer 4 is selectively etched by reactive etching ($CF_4/O_2$) using the resist film 5 as the mask, which opens a via hole 6 that reaches to the lower level interconnect 3. Next, as shown in FIG. 1(c), the resist film 5 is removed by oxygen plasma treatment and the residual resist film and resist film oxides, etc., are then completely removed by treatment with an alkaline liquid. The surface is also rinsed and dried.

Silanol can be generated in the interlevel dielectric layer 4 during the removal of the resist film. As a consequence thereof, the semiconductor substrate 1 provided with the via hole 6 is heated for from 1 minute to 1 hour and preferably from 5 to 20 minutes using a low-vacuum plant. The pressure during this heat treatment should be in the range from 1 to 1,000 torr, and the temperature during this heat treatment should be in the range from 150 to 550° C. and preferably from 150 to 450° C.

Next, as shown in FIG. 1(d), an electrically conductive layer is formed over the entire surface by sputtering a metal, e.g., aluminum. This is then etched back to leave an interlevel interconnect 7 within the via hole 6. An upper level interconnect 8 and an interlevel dielectric layer 9 are subsequently formed on the etched-back surface by the same methods as used for the lower level interconnect 3 and interlevel dielectric layer 4. Proceeding as described above produces a multilevel interconnect structure comprising the lower level interconnect 3 and upper level interconnect 8 on the semiconductor substrate 1.

The HSR-derived insulating thin film (interlevel dielectric layer 4) is subjected to heat treatment. This thermal episode thoroughly condenses the silanol generated within the thin film into siloxane bonds (Si—O—Si) and at the same time can thoroughly eliminate the water fraction bound on or contained in the thin film due to the presence of the hydrophilic silanol.

The method of this invention makes it possible during semiconductor device fabrication to reduce the amount of water outmigrating from the insulating thin film during the process of filling via holes with metal and thereby prevents an increase in contact resistance between upper and lower level interconnects and prevents the generation of the defects known as "poisoned vias". This suppression of the contact resistance between interconnects also enables additional miniaturization of the semiconductor element. This inhibition of moisture absorption by the insulating film enables the fabrication of highly reliable semiconductor devices in which corrosion of the conductive layer and deterioration in insulating thin film performance have been inhibited.

The heat treatment can be run at ambient pressure or a slightly elevated pressure, or, when a vacuum plant is used, the heat treatment can be run using an inexpensive plant that need be capable of achieving only a low vacuum (a slightly reduced pressure), i.e., a pressure of 1 torr or more. This avoids increased semiconductor device fabrication costs and enables a simple process control.

The pressure during heat treatment according to this invention must be within the range from 1 to 1,000 torr. Condensation of the silanol groups and dehydration will be inadequate when this pressure exceeds 1,000 torr. Pressures below 1 torr cause an increase in the cost of the vacuum installation and have negative effects on the device. The temperature must be between 150 and 550° C. and is preferably between 150 and 450° C. Condensation of the silanol groups and dehydration will be inadequate when the temperature is less than 150° C., while temperatures in excess of 550° C. are associated with problems such as an increase in the cost of heat treatment and negative effects on the device.

The heat treatment time is preferably from 1 minute to 1 hour. Condensation of the silanol groups and dehydration will be inadequate when the heat treatment time is not at least 1 minute, while additional effects cannot be expected even when the heat treatment time exceeds 1 hour. The heat treatment atmosphere is not critical and can be an inert gas such as nitrogen, air, argon, etc., or water vapor, high concentrations of oxygen, an alkaline gas, and so forth.

Hydrogen silsesquioxane resin is a polymer expressed by the general formula $(HSiO_{3/2})_n$ where n is an integer. The insulating thin film can be formed by spin coating a solvent solution of hydrogen silsesquioxane resin on the substrate followed by baking. Since the molecular weight of hydrogen silsesquioxane resin is greater than that of polysilicic acid and the like, an advantage to SOG films deriving from hydrogen silsesquioxane resin is that they can be formed in greater thicknesses than other inorganic SOG films. Films formed by either the partial or complete conversion of the hydrogen silsesquioxane resin into silica ($SiO_2$) can be used as the HSR-derived insulating thin films.

The solvent used to dissolve the hydrogen silsesquioxane resin is not critical and is exemplified by aromatic solvents such as toluene, xylene, and the like; aliphatic solvents such as hexane, heptane, octane, and the like; ketone solvents such as methyl ethyl ketone, methyl isobutyl ketone (MIBK), and the like; ester solvents such as butyl acetate, isoamyl acetate, and the like; and silicone solvents, for example, linear siloxanes such as 1,1,1,3,3,3-hexamethyldisiloxane, 1,1,3,3-tetramethyldisiloxane, and so forth, cyclic siloxanes such as 1,1,3,3,5,5,7,7-octamethyltetracyclosiloxane, 1,3,5,7-tetramethyltetracyclosiloxane, and the like, and silane compounds such as tetramethylsilane, dimethyldiethylsilane, and the like. Combinations of two or selections from the solvents may also be used.

The solvent solution of hydrogen silsesquioxane resin may also contain other additives, cure accelerators, and so forth. The additives are exemplified by hydrocarbon solvents such as amylbenzene, isopropylbenzene, 1,2-diethylbenzene, 1,3-diethylbenzene, 1,4-diethylbenzene, cyclohexylbenzene, dipentene, 2,6-dimethylnaphthalene, p-cymene, camphor oil, solvent naphtha, cis-decalin, transdecalin, decane, tetralin, turpentine oil, kerosene, dodecane, dodecylbenzene (branched type), cyclohexylbenzene, and the like; ketone and aldehyde solvents such as acetophenone, isophorone, phorone, methylcyclohexanone, methyl n-heptyl ketone, and the like; ester solvents such as diethyl phthalate, benzyl acetate, γ-butyrolactone. dibutyl oxalate, 2-ethylhexyl acetate, ethyl benzoate, benzyl formate, and the like; and also by diethyl sulfate, sulfolane, halogenated hydrocarbon solvents, alcohol solvents, polyhydric alcohol solvents, carboxylic acid anhydride solvents, phenol solvents, silicone solvents, and the like. The cure accelerator can be, for example, a platinum-containing compound such as chloroplatinic acid hexahydrate.

This invention is applied with particularly good effect when the insulating thin film is etched using an organic resin resist film as the mask in order form via holes therein, this resist film is subsequently removed by oxygen plasma treatment, and the residual resist film and resist film oxides, etc., are completely removed by alkaline liquid. Preferred for use as the alkaline remover of the organic resin resist film are the aqueous solution of 2-(2-aminoethoxy)ethanol/hydroxylamine, the dimethyl sulfoxide solution of aminoethanol, and the like.

The formation of an insulating thin film in semiconductor devices has been explained herein, but this invention can also be used to form insulating thin films in devices other than semiconductor devices.

According to this invention, condensation of silanol and dehydration can be effected to a high degree at or near ambient pressure by forming an HSR-derived insulating thin film on a substrate and heating this insulating thin film at 150 to 550° C. under a pressure of 1 to 1,000 torr.

By enabling a reduction in the amount of water outmigrating from the insulating thin film during the process of filling via holes with metal during semiconductor device fabrication, the generation of defects resulting from an increase in contact resistance between upper and lower level interconnects can be prevented. This also enables an additional miniaturization of semiconductor elements.

EXAMPLES

Example 1

Hydrogen silsesquioxane resin was synthesized by the method described in Example 1 of Japanese Patent Publication (Kokoku) Number Sho 47-31838 (31,838/1972) (U.S. Pat. No. 3,615,272). This hydrogen silsesquioxane resin was subjected to molecular weight fractionation according to the method described in Example 1 of Japanese Patent Application Laid Open (Kokai or Unexamined) Number Hei 6-157760 (157,760/1994) (U.S. Pat. No. 5,416,190) to obtain a fraction with a number-average molecular weight of 5,830, a weight-average molecular weight of 11,200, and a softening point of 180° C. This fraction was dissolved in methyl isobutyl ketone to give a solution containing 18 wt % solids. This solution was used to form a thin film with a thickness of approximately 0.7 μm on a silicon wafer. An insulating thin film was then formed by baking this wafer in a quartz oven under a nitrogen current at 400° C. for 1 hour.

A resist film pattern (novolac resin positive-type resist) was formed on the silicon wafer and reactive etching ($CF_4/O_2$) was carried out using this resist as the mask. The resist film was then removed by oxygen plasma treatment and the wafer was soaked for 15 minutes in an amine-type resist remover comprising an aqueous solution of 2-(2-aminoethoxy)ethanol/hydroxylamine, rinsed in alcohol, and dried at 100° C. for 10 minutes. The wafer was then heated in air under ambient pressure at 400° C. for 10 minutes.

Comparative Example 1

An insulating thin film was formed on a silicon wafer in the same manner as in Example 1. A resist film pattern (novolac resin positive-type resist) was formed on the silicon wafer and reactive etching ($CF_4/O_2$) was carried out using this resist as the mask. The resist film was then removed by oxygen plasma treatment and the wafer was soaked for 15 minutes in an amine-type resist remover comprising an aqueous solution of 2-(2-aminoethoxy)ethanol/hydroxylamine, rinsed in alcohol, and dried at 100° C. for 10 minutes.

Figure 2:
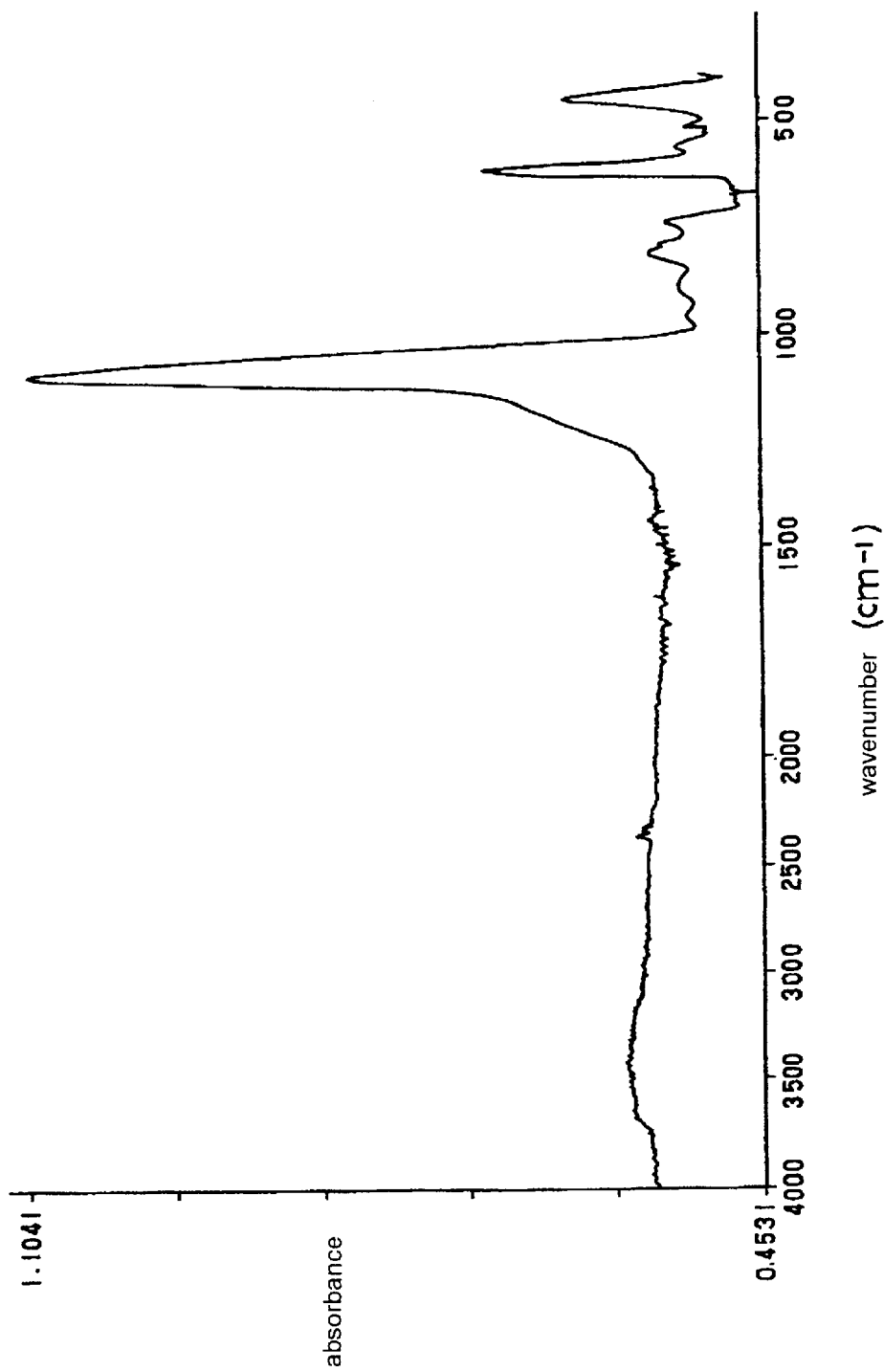
FIG. 2 contains the infrared absorption spectrum of the insulating thin film produced in Example 1.
Figure 3:
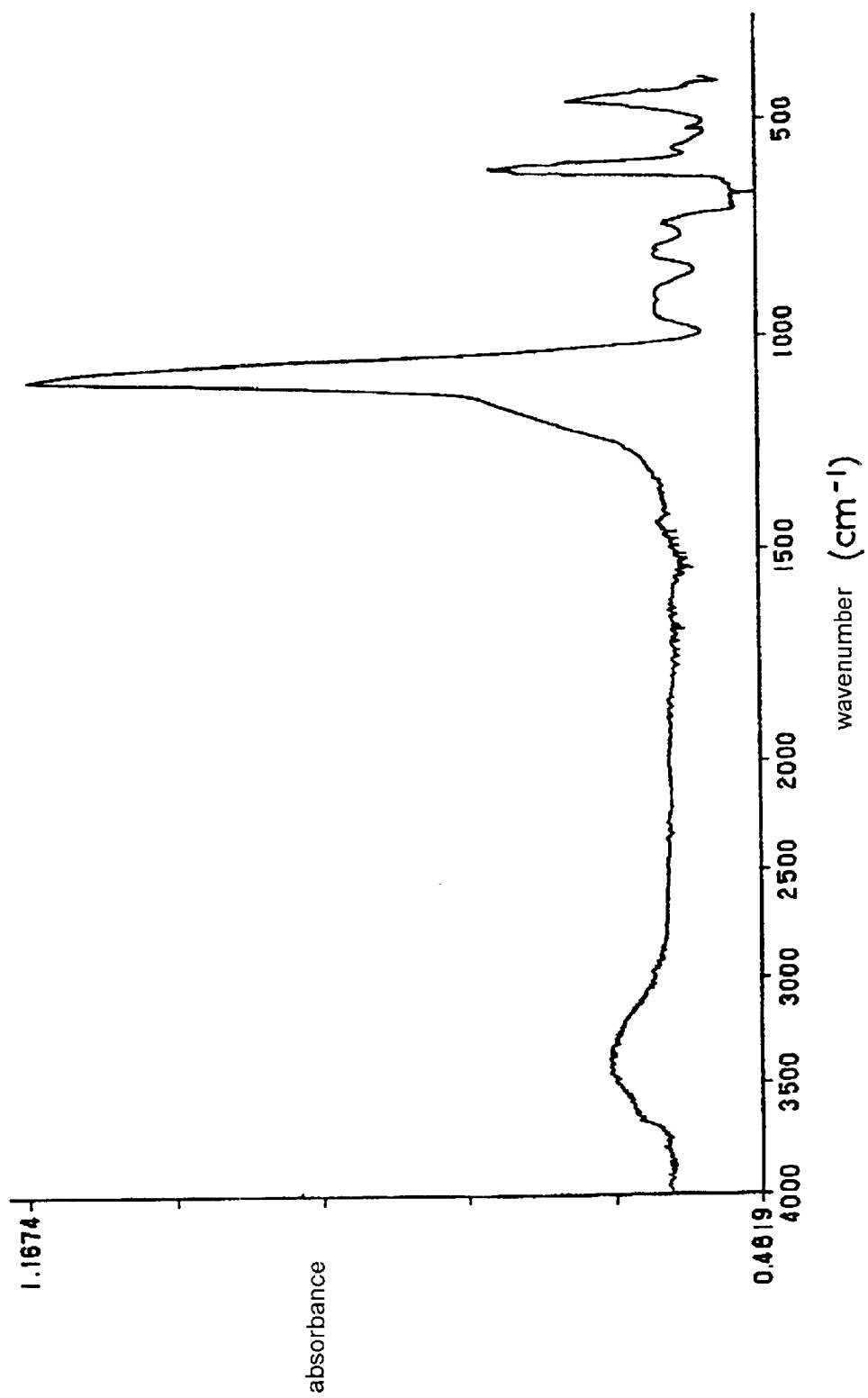
FIG. 3 contains the infrared absorption spectrum of the insulating thin film produced in Comparative Example 1.

The infrared absorption spectra of the insulating thin films produced in Example 1 and Comparative Example 1 were measured and are shown in FIGS. 2 and 3, respectively. The y-axis in FIGS. 2 and 3 plots the absorbance and the x-axis plots the wavenumber in $cm^{-1}$. A decline in the absorption at 2900 to 3800 $cm^{-1}$ assigned to silanol and water can be seen in FIGS. 2 as compared to FIG. 3.

The insulating thin films produced in Example 1 and Comparative Example 1 were each heated and the amount of dehydration was measured by thermal desorption gas analysis (TDS). The amount of dehydration from the insulating thin film in the working example was $7.6 \times 10^{21}$ atom/$cm^3$, while in contrast the amount of dehydration from the insulating thin film in the comparative example was $1.3 \times 10^{22}$ atom/$cm^3$.

Example 2

The hydrogen silsesquioxane resin solution prepared in Example 1 was used to form the interlevel dielectric level in a semiconductor device that contained an aluminum multilevel interconnect structure (interconnect pattern with a feature height of 0.5 μm and a feature width and feature spacing of 0.18 μm each) on a silicon wafer.

The base features were first coated with a CVD film and the solution was spin coated on the silicon wafer using a preliminary rotation of 500 rpm for 3 seconds and then a main rotation of 5,000 rpm for 10 seconds. After the solvent had been thoroughly evaporated, standing for 10 minutes at room temperature gave a film with a thickness of 8,010 angstroms in its deepest section. The wafer was then baked for 1 hour at 400° C. under a nitrogen current in a quartz firnace.

A resist film pattern (novolac resin positive-type resist) was formed on the silicon wafer and reactive etching ($CF_4/O_2$) was carried out using this resist film as the mask in order to open via holes in the interlevel dielectric layer. The resist film was then removed by oxygen plasma treatment and the wafer was soaked for 15 minutes in an amine-type resist remover comprising the aqueous solution of 2-(2-aminoethoxy)ethanol/hydroxylamine, rinsed with alcohol, and dried at 100° C. for 10 minutes. The wafer was then heated in air under ambient pressure at 400° C. for 10 minutes.

Comparative Example 2

An interlevel dielectric layer was formed on a silicon wafer in the same manner as in Example 2. A resist film pattern (novolac resin positive-type resist) was formed on the silicon wafer and reactive etching ($CF_4/O_2$) was carried out using this resist film as the mask to open via holes in the interlevel dielectric layer. The resist film was then removed by oxygen plasma treatment and the wafer was soaked for 15 minutes in an amine-type resist remover comprising an aqueous solution of 2-(2-aminoethoxy)ethanol/hydroxylamine, rinsed with alcohol, and dried at 100° C. for 10 minutes.

The contact resistance between the upper and lower level interconnects in the semiconductor devices produced in the Example 2 and Comparative Example 2 was measured. The contact resistance in the semiconductor device from Example 2 was reduced to one-tenth that in the semiconductor device from Comparative Example 2.

What is claimed is:

1. A method for forming insulating thin films wherein the method comprises (A) coating hydrogen silsesquioxane resin onto a substrate; (B) curing the hydrogen silsesquioxane resin to produce an insulating thin film; (C) etching the insulating thin film using a resist film mask; (D) treating the insulating thin film with an alkaline liquid; and heating the etched and treated insulating thin film at a pressure in the range of 1 to 1,000 torr and at a temperature in the range of 150° C. to 550° C.

2. The method as claimed in claim 1 wherein the insulating thin film is heated from 1 minute to 1 hour.

3. The method as claimed in claim 1 wherein the insulating thin film is heated to a temperature in the range of 150° C. and 450° C.

4. The method as claimed in claim 1 wherein the hydrogen silsesquioxane resin is a polymer having the general formula $(HSiO_{3/2})_n$ where n is an integer.

5. The method as claimed in claim 1 wherein the hydrogen silsesquioxane resin is dissolved in a solvent.

6. The method as claimed in claim 1 wherein the hydrogen silsesquioxane resin additionally contains an additive.

7. The method as claimed in claim 1 wherein the hydrogen silsesquioxane resin additionally contains a cure accelerator.

8. The method as claimed in claim 1 wherein the insulating thin film is etched using a resist film mask and treated with an alkaline liquid prior to the heating (C).

9. The method as claimed in claim 8 wherein the alkaline liquid is an aqueous solution of 2-(2-aminoethoxy)ethanol/hydroxylamine.

10. The method as claimed in claim 8 wherein the alkaline liquid is a dimethyl sulfoxide solution of aminoethanol.

11. A method for producing semiconductor devices wherein the method comprises
    (A) forming a base insulating layer on a semiconductor device having a semiconductor element formed thereon;
    (B) forming an electrically conductive layer over the base insulating layer;
    (C) patterning the electrically conductive layer to form a lower level interconnect;
    (D) coating hydrogen silsesquioxane resin over the lower level interconnect and thereafter curing the hydrogen silsesquioxane resin to form an interlevel dielectric layer;
    (E) forming a resist film over the interlevel dielectric and patterning the resist film so as to provide an opening directly above the lower level interconnect;
    (F) selectively etching the resist film to open a via hole which reaches to the lower level interconnect;
    (G) removing any remaining resist film to form the semiconductor device; and
    (H) heating the semiconductor device for a period of from 1 minute to 1 hour; at a pressure in the range of 1 to 1,000 torr and at a temperature in the range of 150° C. to 550° C.

12. The method as claimed in claim 11 wherein the hydrogen silsesquioxane resin is dissolved in a solvent.

13. The method as claimed in claim 11 wherein the resist film is removed by oxygen plasma and any residual resist film is removed by treatment with an alkaline liquid.

14. The method as claimed in claim 11 wherein the hydrogen silsesquioxane resin has the formula $(HSiO_{3/2})_n$ wherein n is an integer.

15. The method as claimed in claim 11 wherein the hydrogen silsesquioxane resin is cured by heating.

16. The method as claimed in claim 11 wherein the hydrogen silsesquioxane resin is cured by exposure to high energy radiation.

17. The method as claimed in claim 11 wherein the semiconductor device is heated for a period of from 5 to 20 minutes; at a pressure in the range of 1 to 1,000 torr and at a temperature in the range of 150° C. to 450° C.

18. The method as claimed in claim 11 wherein additionally an interconnect interlevel is formed in the via hole and an upper level interconnect and an upper level interlevel dielectric layer are formed thereon.

* * * * *